(12) United States Patent
Neo et al.

(10) Patent No.: US 8,476,109 B2
(45) Date of Patent: Jul. 2, 2013

(54) SEMICONDUCTOR WORKPIECE CARRIERS AND METHODS FOR PROCESSING SEMICONDUCTOR WORKPIECES

(75) Inventors: Chee Peng Neo, Singapore (SG); Hong Hak Teo, Singapore (SG); Jamilon Bin Sukami, Singapore (SG)

(73) Assignee: Micron Technology, Inc., Boise, ID (US)

( * ) Notice: Subject to any disclaimer, the term of this patent is extended or adjusted under 35 U.S.C. 154(b) by 4 days.

(21) Appl. No.: 13/094,576

(22) Filed: Apr. 26, 2011

(65) Prior Publication Data

US 2011/0287581 A1    Nov. 24, 2011

Related U.S. Application Data

(62) Division of application No. 11/742,115, filed on Apr. 30, 2007, now Pat. No. 8,011,513.

(30) Foreign Application Priority Data

Apr. 19, 2007    (SG) .................................. 200702852

(51) Int. Cl.
*H01L 21/00*    (2006.01)
(52) U.S. Cl.
USPC ........... 438/106; 438/460; 438/462; 438/464; 438/465; 206/710; 206/703; 257/E21.599; 428/221; 428/339
(58) Field of Classification Search
USPC ......................................................... 438/106
See application file for complete search history.

(56) References Cited

U.S. PATENT DOCUMENTS

| | | | |
|---|---|---|---|
| 4,687,693 | A | 8/1987 | Sheyon et al. |
| 5,907,151 | A | 5/1999 | Gramann et al. |
| 5,950,072 | A | 9/1999 | Queyssac |
| 6,072,239 | A | 6/2000 | Yoneda et al. |
| 6,088,901 | A | 7/2000 | Huber et al. |
| 6,133,070 | A | 10/2000 | Yagi et al. |
| 6,288,904 | B1 | 9/2001 | Houdeau et al. |
| 6,373,140 | B1 | 4/2002 | Onodera et al. |
| 6,582,983 | B1 | 6/2003 | Runyon et al. |

(Continued)

FOREIGN PATENT DOCUMENTS

| | | |
|---|---|---|
| EP | 1122776 A | 8/2001 |
| JP | 2004193237 A | 7/2004 |
| WO | 0120659 A1 | 3/2001 |
| WO | 2006023753 A2 | 3/2006 |

OTHER PUBLICATIONS

3M, "Wafer Support System for Ultra Thin Wafer Backgrinding", Apr. 2004.

(Continued)

*Primary Examiner* — Michael Lebentritt
*Assistant Examiner* — Aaron Dehne
(74) *Attorney, Agent, or Firm* — Perkins Coie LLP

(57) ABSTRACT

Semiconductor workpiece carriers and methods for processing semiconductor workpieces are disclosed herein. In one embodiment, a semiconductor workpiece carrier assembly includes (a) a support structure having an opening sized to receive at least a portion of a semiconductor workpiece, and (b) a replaceable carrier positioned at the opening. The replaceable carrier includes a base and an adhesive layer on the base. The base has a surface, and the adhesive layer covers only a section of the surface of the base. The adhesive layer releasably attaches the replaceable carrier to the support structure.

18 Claims, 6 Drawing Sheets

U.S. PATENT DOCUMENTS

| | | | |
|---|---|---|---|
| 6,582,994 | B2 | 6/2003 | Jiang et al. |
| 6,770,961 | B2 | 8/2004 | Lee |
| 6,984,544 | B2 | 1/2006 | Cloud et al. |
| 7,098,152 | B2 | 8/2006 | Moore |
| 7,169,691 | B2 | 1/2007 | Doan |
| 7,498,240 | B2 | 3/2009 | Hiatt et al. |
| 2002/0006686 | A1 | 1/2002 | Cloud et al. |
| 2002/0014465 | A1* | 2/2002 | Chung ................ 211/126.1 |
| 2002/0022141 | A1 | 2/2002 | Nakamura et al. |
| 2002/0027313 | A1 | 3/2002 | Shibano et al. |
| 2002/0187589 | A1 | 12/2002 | Tsujimoto |
| 2003/0020062 | A1 | 1/2003 | Faris |
| 2003/0088959 | A1 | 5/2003 | Tsujimoto |
| 2003/0107126 | A1 | 6/2003 | Joshi |
| 2003/0132533 | A1 | 7/2003 | Kawahara et al. |
| 2003/0143819 | A1 | 7/2003 | Hedler et al. |
| 2004/0017000 | A1 | 1/2004 | Chiu et al. |
| 2005/0035357 | A1 | 2/2005 | Fjelstad |
| 2005/0037537 | A1 | 2/2005 | Kim et al. |
| 2005/0170612 | A1 | 8/2005 | Miyanari et al. |
| 2005/0176171 | A1 | 8/2005 | Miyaki et al. |
| 2005/0258537 | A1 | 11/2005 | Huang et al. |
| 2006/0102987 | A1* | 5/2006 | Saiki et al. ................ 257/632 |
| 2007/0017630 | A1 | 1/2007 | Kirby et al. |
| 2007/0066184 | A1 | 3/2007 | Nagamoto et al. |
| 2007/0093040 | A1 | 4/2007 | Sekiya |
| 2007/0225852 | A1 | 9/2007 | Hong |
| 2008/0014679 | A1 | 1/2008 | Shen et al. |
| 2008/0261383 | A1 | 10/2008 | Neo et al. |
| 2009/0081852 | A1 | 3/2009 | Tanaka et al. |
| 2009/0159208 | A1 | 6/2009 | Kirby |
| 2010/0252915 | A1 | 10/2010 | Wood et al. |

OTHER PUBLICATIONS

Decision issued Dec. 23, 2010 in R.O.C. (Taiwan) Patent Application No. 097114532, 7 pages.

International Search Report and Written Opinion for International Application No. PCT/US2008/060912, Aug. 28, 2008.

Kallender, P., "Fujitsu sculpts ultra-thin wafers for multichip packs," EE Times, Dec. 4, 2001.

Mould, D. J. et al., "A New Alternative for Temporary Wafer Mounting," GaAs ManTech, Conference Proceedings, pp. 109-112, Apr. 2002.

Office Action issued Jun. 23, 2010 in R.O.C. (Taiwan) Patent Application No. 097114532, 18 pages.

Search Report and Written Opinion issued Jan. 29, 2009 for Singapore Application No. 200702852-5.

Taiko Process, Disco Corporation, retrieved from the Internet on Feb. 23, 2009, <http:www.disco.co.jp/eg/solution/library/taiko.html>.

* cited by examiner

SEMICONDUCTOR WORKPIECE CARRIERS AND METHODS FOR PROCESSING SEMICONDUCTOR WORKPIECES

CROSS-REFERENCE TO RELATED APPLICATIONS

This application is a divisional of U.S. patent application Ser. No. 11/742,115, filed Apr. 30, 2007, titled "SEMICONDUCTOR WORKPIECE CARRIERS AND METHODS FOR PROCESSING SEMICONDUCTOR WORKPIECES," which claims foreign priority benefits of Republic of Singapore Application No. 200702852-5, now Republic of Singapore Patent No. 147330, each of which is incorporated herein by reference in its entirety.

TECHNICAL FIELD

The present disclosure is related to semiconductor workpiece carriers and methods for processing semiconductor workpieces.

BACKGROUND

Processors, memory devices, imagers, and other types of microelectronic devices are often manufactured on semiconductor workpieces or other types of workpieces. In a typical application, several individual dies (e.g., devices) are fabricated on a single workpiece using sophisticated and expensive equipment and processes. Individual dies generally include an integrated circuit and a plurality of bond-pads coupled to the integrated circuit. The bond-pads provide external electrical contacts on the die through which supply voltage, signals, etc., are transmitted to and from the integrated circuit. The bond-pads are usually very small, and they are arranged in an array having a fine pitch between bond-pads. The dies can also be quite delicate. As a result, after fabrication, the dies are packaged to protect the dies and to connect the bond-pads to another array of larger terminals that is easier to connect to a printed circuit board. The package can then be electrically connected to other microelectronic devices or circuits in many types of consumer or industrial electronic products.

Electronic product manufacturers are under continuous pressure to reduce the size of their products. Accordingly, microelectronic die manufacturers seek to reduce the size of the packaged dies incorporated into the electronic products. One approach to reducing the size of packaged dies is to reduce the thickness of the dies. For example, the backside of a wafer is often ground to reduce the thickness of the dies formed on the wafer. After backgrinding, the wafer is attached to a die attach film tape and then cut to singulate the dies. The die attach film tape includes a base and an adhesive layer on the base. After singulation, the dies are removed from the base and placed on a carrier tape for temporary storage. When the dies are removed from the base, sections of the adhesive layer remain attached to corresponding dies to facilitate subsequent attachment of the dies to a substrate for packaging. Conventional carrier tapes include a base and an adhesive layer on the base. For purposes of brevity and clarity, in this section the adhesive layer of the die attach film tape that remains attached to the dies will be referred to as the die attach adhesive, and the adhesive layer of the carrier tape will be referred to as the carrier tape adhesive. The singulated dies are attached to the carrier tape with the die attach adhesive facing the carrier tape adhesive.

One drawback of conventional carrier tapes is that each die needs to be removed from the carrier tape after a relatively short time (e.g., two to three weeks) because the bond between the die attach adhesive and the carrier tape adhesive strengthens over time. If a die is stored on a carrier tape for too long, several problems may result. First, removing the die can cause delamination between the die and the die attach adhesive because the bond between the die attach adhesive and the carrier tape adhesive may be stronger than the bond between the die attach adhesive and the die. Second, an increased force is required to separate the die from the carrier tape, and the increased force can crack or otherwise damage the die. Third, sections of the carrier tape adhesive may remain attached to the die attach adhesive after the die is removed, which reduces adhesive strength of the die onto the substrate or leadframe. The may result in delamination of the die from the substrate or leadframe due to insufficient adhesion to the latter. Accordingly, there is a need to improve the processing of semiconductor workpieces.

DETAILED DESCRIPTION

Specific details of several embodiments of the disclosure are described below with reference to semiconductor workpiece carriers and methods for processing semiconductor workpieces. The semiconductor workpieces include substrates upon which and/or in which microelectronic devices, micromechanical devices, data storage elements, optics, read/write components, and other features are fabricated. For example, SRAM, DRAM (e.g., DDR-SDRAM), flash-memory (e.g., NAND flash-memory), processors, imagers, and other types of devices can be constructed on semiconductor workpieces. The semiconductor workpieces can be semiconductor wafers, glass substrates, dielectric substrates, or many other types of substrates. Moreover, several other embodiments of the invention can have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 1A-5.

Figure 1A:
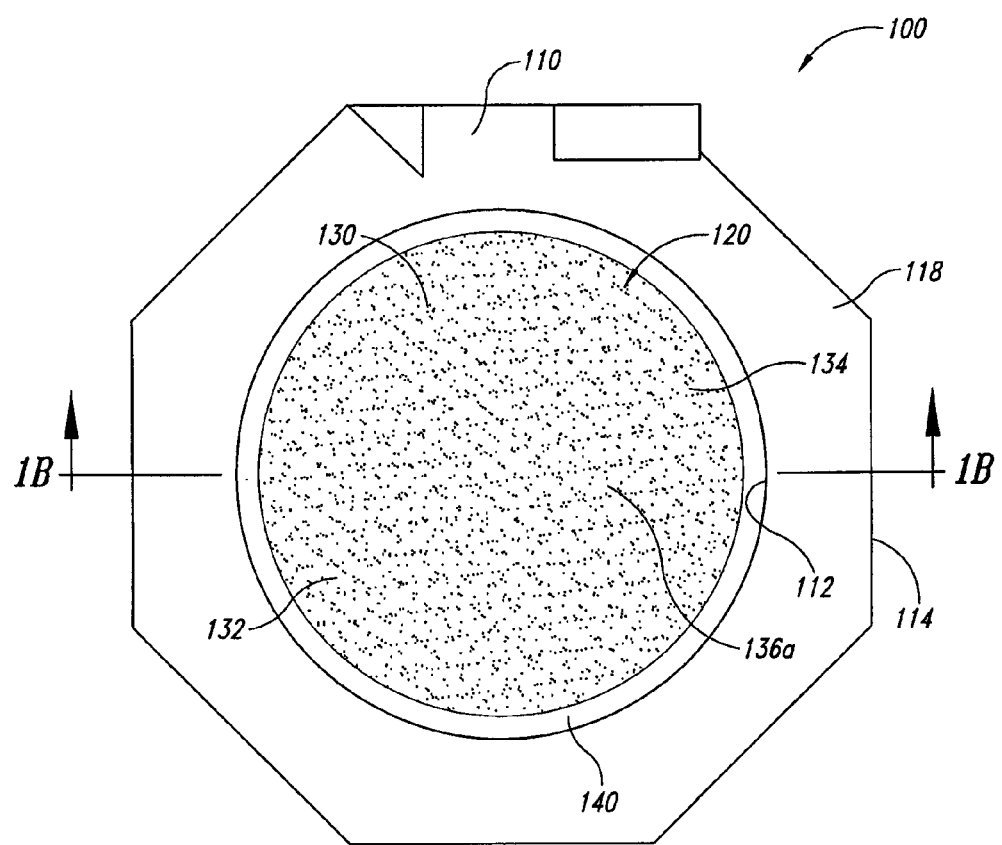
FIG. 1A is a top plan view of a carrier assembly for processing semiconductor workpieces in accordance with one embodiment of the disclosure.
Figure 1B:
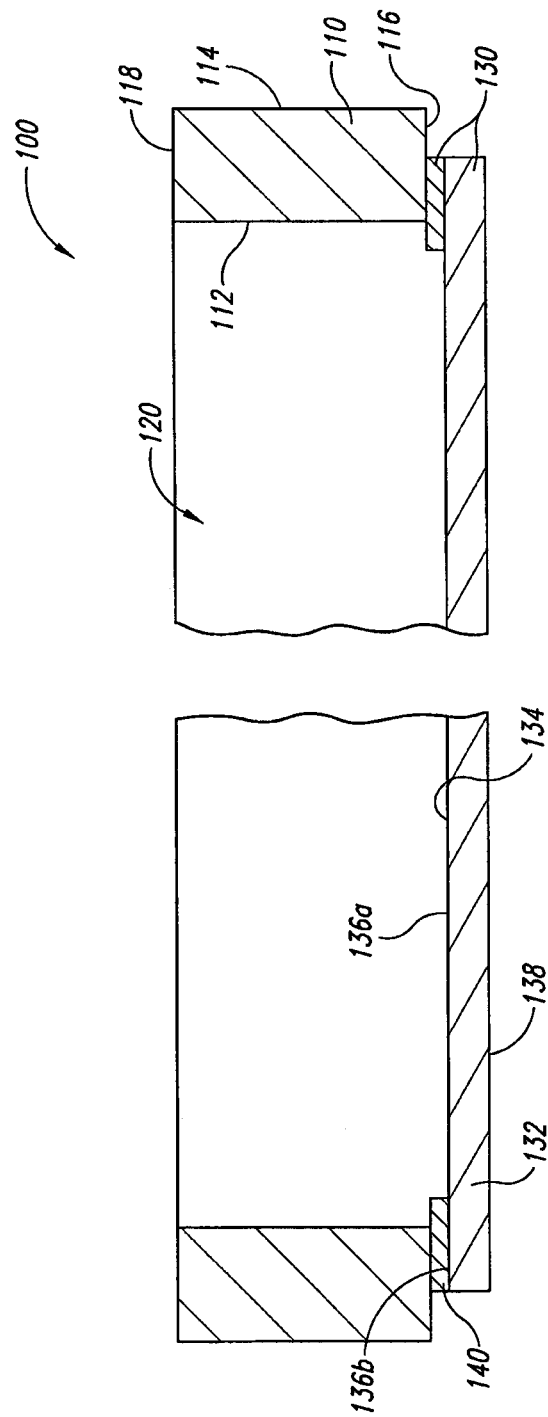
FIG. 1B is a schematic side cross-sectional view of the carrier assembly taken generally along the line 1B-1B of FIG. 1A.

In one embodiment shown in FIGS. 1A and 1B, a semiconductor workpiece carrier assembly 100 includes (a) a support structure 110 having an opening sized to receive at least a portion of a semiconductor workpiece, and (b) a replaceable carrier 130 positioned at the opening. The replaceable carrier 130 includes a base 132 and an adhesive layer 140 on the base. The base 132 has a surface, and the adhesive layer 140 covers only a section of the surface. The adhesive layer also releasably attaches the replaceable carrier to the support structure.

FIG. 1A is a top plan view of a carrier assembly 100 for processing semiconductor workpieces in accordance with one embodiment of the disclosure. FIG. 1B is a schematic side cross-sectional view of the carrier assembly 100 taken generally along the line 1B-1B of FIG. 1A. Referring to both FIGS. 1A and 1B, the carrier assembly 100 is configured to temporarily support or carry a semiconductor workpiece, or a portion of such a workpiece (e.g., a microelectronic die) during and/or between processing procedures. For example, the carrier assembly 100 may support a semiconductor workpiece during a dicing procedure as illustrated below in FIG. 3, or the assembly 100 may carry a plurality of microelectronic dies after a wafer reconstruction process as illustrated below in FIGS. 2A and 2B. In either case, after the carrier assembly 100 temporarily supports the semiconductor component(s), the component(s) can be removed from the assembly 100.

The carrier assembly 100 of the illustrated embodiment includes a support structure 110 and a replaceable carrier 130 releasably attached to the support structure 110. The support structure 110 can include a generally annular frame having an inner surface 112, an outer surface 114 opposite the inner surface 112, a first surface 116 (FIG. 1B), and a second surface 118 opposite the first surface 116. The illustrated inner surface 112 defines a generally circular opening 120 sized to receive a semiconductor workpiece. In other embodiments, however, the inner surface 112 of the support structure 110 can have a different configuration. For example, the support structure may not have a generally annular shape, and/or the opening may be sized to receive only a portion of a workpiece.

The replaceable carrier 130 of the illustrated embodiment is releasably attached to the first surface 116 of the support structure 110 and extends across the opening 120. The illustrated replaceable carrier 130 includes a base 132 and an adhesive layer 140 on a portion of the base 132. The base 132 can be a generally flexible film having a first major surface 134 facing the support structure 110 and a second major surface 138 opposite the first major surface 134. The first major surface 134 has a central portion 136a and a generally annular perimeter portion 136b outboard the central portion 136a.

The adhesive layer 140 is disposed on the perimeter portion 136b of the first major surface 134 and attaches the base 132 to the support structure 110. In the illustrated embodiment, the adhesive layer 140 is not disposed on the central portion 136a of the first major surface 134 such that the central portion 136a is exposed. As a result, the central portion 136a of the first major surface 134 can provide a support surface to which a semiconductor component or workpiece can be directly attached. In other embodiments, the adhesive layer 140 can be disposed on one or more sections of the central portion 136a. In either case, the adhesive layer 140 covers only a portion of the first major surface 134 so that a section of the surface 134 is exposed.

The adhesive layer 140 enables the replaceable carrier 130 to be selectively detached from the support structure 110 so that the support structure 110 can be reused with another replaceable carrier 130. For example, in several applications, the replaceable carrier 130 may be used to support a single workpiece and, after the workpiece is detached, the carrier 130 can be decoupled from the support structure 110 and a second releasable carrier 130 can be attached to the support structure 110. In other applications, the replaceable carrier 130 may be reused with several different workpieces. In either case, the adhesive layer 140 can include a UV-curable adhesive or other suitable adhesive that can be manipulated to selectively release the replaceable carrier 130 from the support structure 110.

Figure 2A:
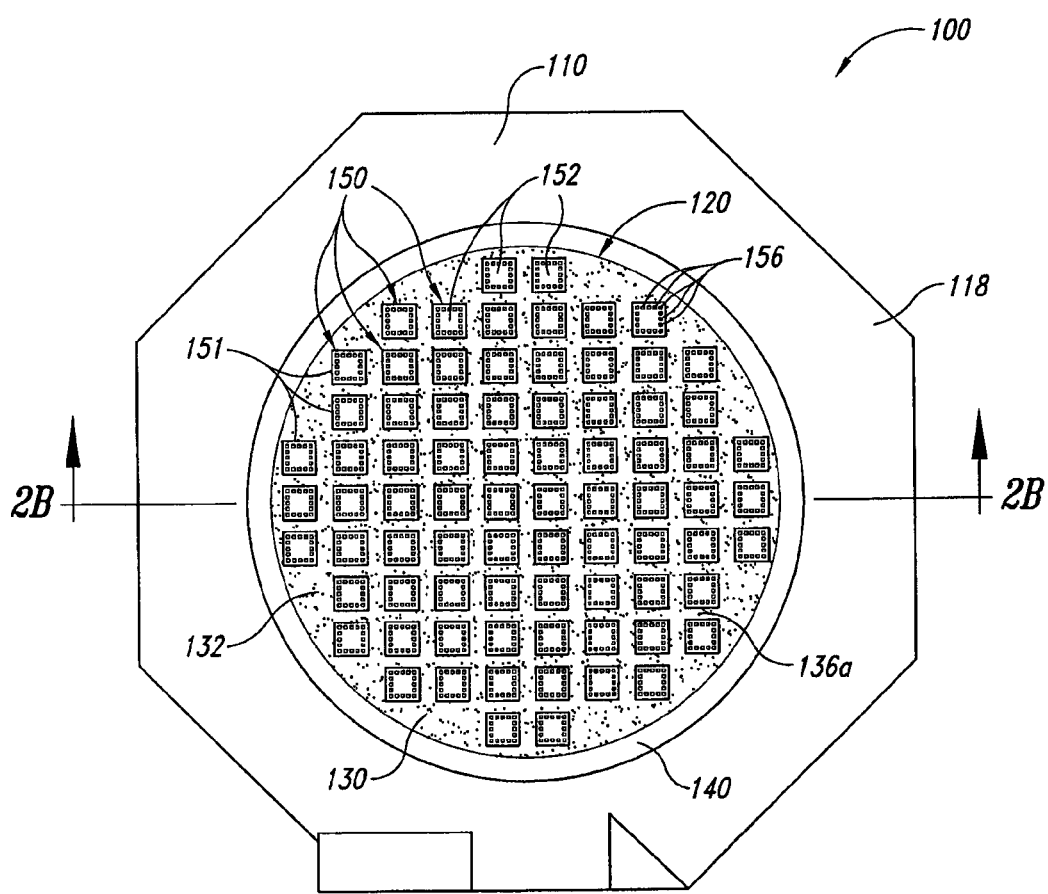
FIG. 2A is a top plan view of the carrier assembly with a plurality of semiconductor components attached to the replaceable carrier.
Figure 2B:
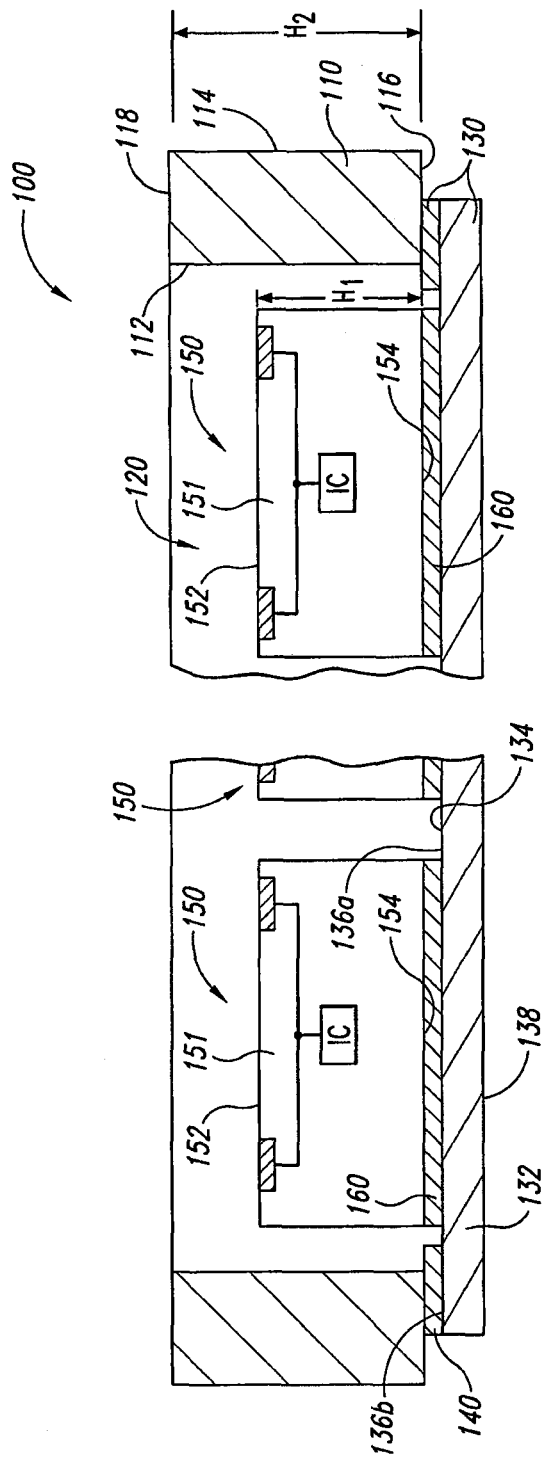
FIG. 2B is a schematic side cross-sectional view of the carrier assembly and the semiconductor components taken substantially along the line 2B-2B of FIG. 2A.
Figure 3:
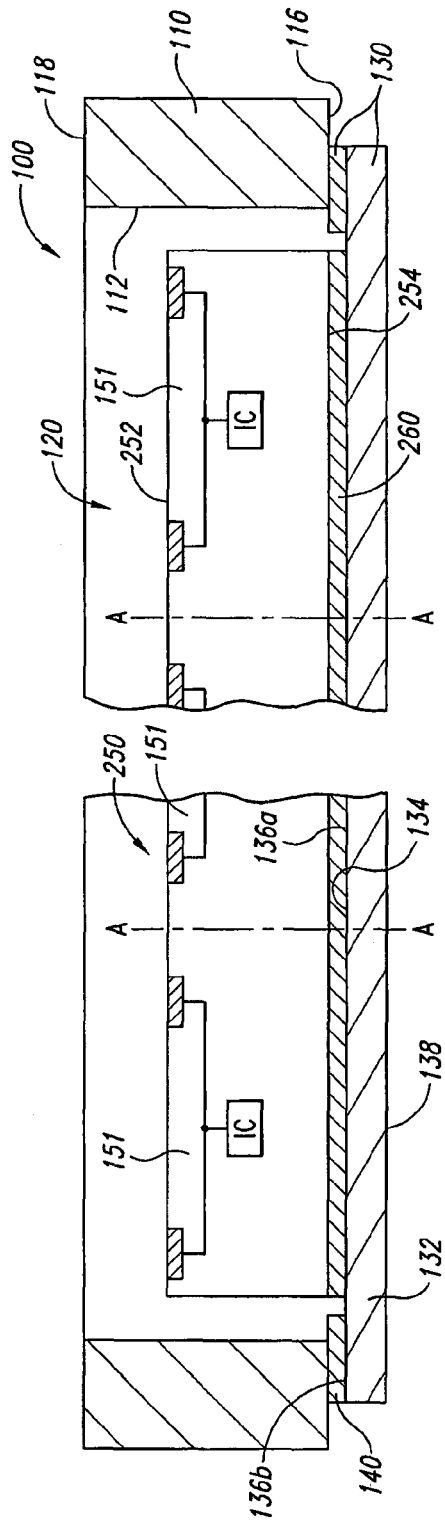
FIG. 3 is a schematic side cross-sectional view of the carrier assembly with a semiconductor workpiece attached to the assembly.

FIGS. 2A-3 illustrate different methods of processing semiconductor components and/or workpieces that utilize the carrier assembly 100 in accordance with several embodiments of the disclosure. Specifically, FIG. 2A is a top plan view of the carrier assembly 100 with a plurality of semiconductor components 150 attached to the replaceable carrier 130. FIG. 2B is a schematic side cross-sectional view of the carrier assembly 100 and the semiconductor components 150 taken substantially along the line 2B-2B of FIG. 2A. Referring to both FIGS. 2A and 2B, the individual semiconductor components 150 include a microelectronic die 151 and an adhesive 160 (FIG. 2B) on the die 151. The dies 151 include an active side 152 and a backside 154 (FIG. 2B) opposite the active side 152. The dies 151 can also include a plurality of terminals (e.g., bond-pads) arranged in an array on one or both of the active side 152 and the backside 154, and the dies can further have an integrated circuit (shown schematically in FIG. 2B) operably coupled to the terminals. In still further embodiments, the dies can include photosensitive arrays. In the illustrated embodiment, the dies 151 have a height $H_1$ (FIG. 2B) that is less than a height $H_2$ (FIG. 2B) of the support structure 110. As such, the dies 151 are received completely within the opening 120 and do not project beyond the second surface 118 of the support structure 110. In other embodiments, however, the height $H_1$ of the dies 151 may be greater than the height $H_2$ of the support structure 110 such that the dies 151 project beyond the second surface 118.

The adhesive 160 can be a die attach film or other suitable coupling member for releasably attaching the backsides 154 of the dies 151 to the replaceable carrier 130. The adhesive 160 can be disposed on the backsides 154 of the dies 151 before the dies 151 are attached to the carrier assembly 100, or the adhesive 160 can be deposited on the replaceable carrier 130 and then the dies 151 can be attached to the adhesive 160. In either case, the semiconductor components 150 are attached directly to the base 132 such that the adhesive layer 140 is not positioned directly between the semiconductor components 150 and the first major surface 134 of the base 132. Rather, the adhesive 160 of the semiconductor component 150 is attached to an exposed portion of the first major surface 134. The adhesive 140 can accordingly be a first adhesive, and the adhesive 160 can be a second adhesive with different properties than the first adhesive.

In one application, the semiconductor components 150 are attached to the carrier assembly 100 as part of a wafer reconstruction process. For example, the dies 151 can be formed on a semiconductor workpiece and then the workpiece can be cut to singulate the dies 151. Before or after singulation, the individual dies 151 may be tested to detect defective dies. The known good dies 151 can be attached to the carrier assembly 100 for further testing, temporary storage, and/or further processing. The semiconductor components 150 may subsequently be detached from the carrier assembly 100 for packaging or other processing.

Several embodiments of the carrier assembly 100 illustrated in FIGS. 1-2B may increase the time that the assembly 100 can support semiconductor components and/or workpieces. Because the first major surface 134 of the base 132 includes an exposed section, the adhesive 160 of the semiconductor component 150 can be attached directly to the base 132 without contacting the adhesive layer 140. As a result, the adhesive 160 of the semiconductor component 150 does not bond with the adhesive layer 140 and cause many of the difficulties encountered with conventional carrier tapes. The adhesive 160 may also be selected to have a lower bonding strength than the adhesive 140 because the adhesive 160 only needs to hold a single component 150, but the adhesive 140 needs to hold weight of the base 130 and all of the components 150 to the support structure 110. Therefore, the semiconductor components 150 can remain attached to the carrier assembly 100 for an increased length of time.

Another embodiment of a releasable carrier 130 for supporting semiconductor components includes a generally flexible base having a first major surface and a second major surface opposite the first major surface. The first major surface has a first portion sized to carry at least one semiconductor component and a second portion different than the first portion. The releasable carrier 130 further includes an adhesive layer 140 disposed on the second portion of the first major surface but not on the first portion of the first major surface. In still another embodiment, a semiconductor component processing assembly includes a semiconductor component releasably coupled to the first portion of the surface of the flexible base. The carrier assembly 100 can be used in the processing of microelectronic dies by attaching the adhesive layer around the perimeter of the replaceable carrier to a support structure and releasably connecting a die to a base of the replaceable carrier. The support structure has an opening, and the die is positioned at least partially in the opening of the support structure and spaced apart laterally from the adhesive layer.

Another embodiment of using the carrier assembly 100 for a method of processing semiconductor components includes providing a semiconductor component having a die with a surface and a first adhesive layer on the surface. After providing the component, the method further includes releasably attaching the component to a flexible carrier with the first adhesive layer contacting a first portion of a base of the carrier. The carrier further includes a second adhesive layer on a second portion of the base but not on the first portion.

FIG. 3 is a schematic side cross-sectional view of the carrier assembly 100 with a semiconductor workpiece 250 attached to the assembly 100. The illustrated semiconductor workpiece 250 includes a plurality of microelectronic dies 151, an active side 252, and a backside 254 opposite the active side 252. In other embodiments, the workpiece 250 may include other features in lieu of or in addition to the dies 151. In either case, an adhesive 260 releasably attaches the backside 254 of the workpiece 250 to the first major surface 134 of the replaceable carrier 130. The workpiece 250 is positioned such that the adhesive layer 140 of the replaceable carrier 130 is outboard and spaced laterally apart from the workpiece 250. In other embodiments, a portion of the workpiece 250 and/or the adhesive 260 may contact the adhesive layer 140.

The carrier assembly 100 is configured to temporarily support or carry the workpiece 250 during and/or between processing procedures. For example, the carrier assembly 100 may support the workpiece 250 during a dicing procedure in which the workpiece 250 is cut with a laser, saw, or other mechanism along lines A-A to singulate the individual dies 151. After singulation, the individual dies 151 can be removed from the carrier assembly 100 for packaging or other processing.

Figure 4:
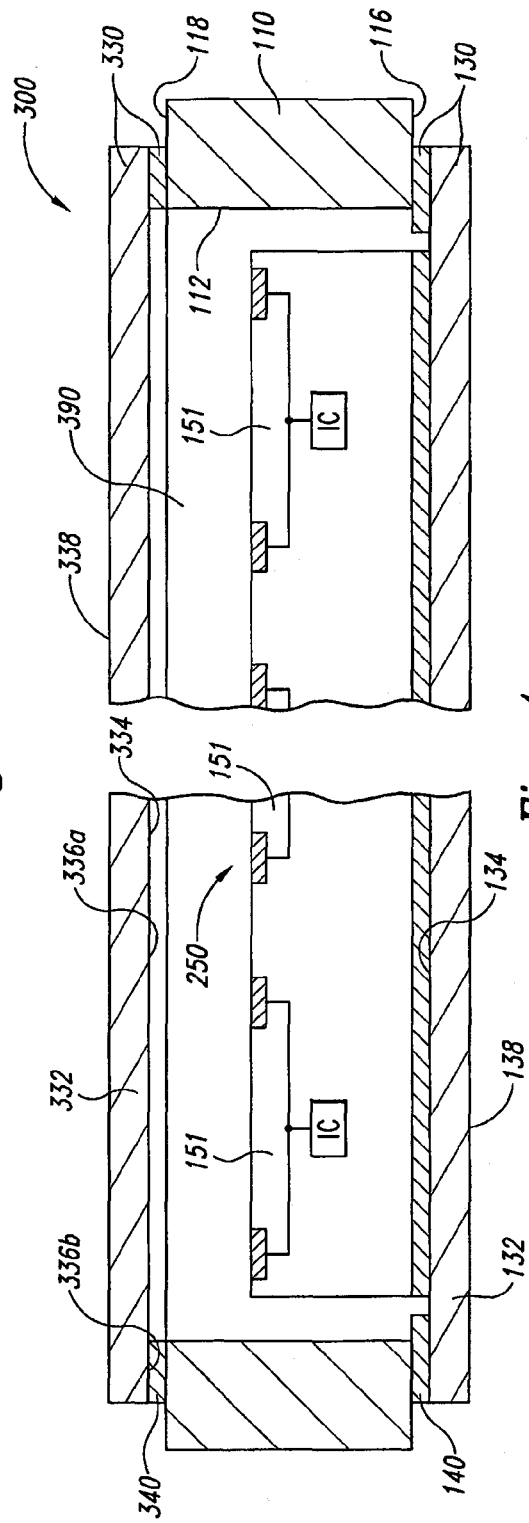
FIG. 4 is a schematic side cross-sectional view of a carrier assembly in accordance with another embodiment of the disclosure.

FIG. 4 is a schematic side cross-sectional view of a carrier assembly 300 in accordance with another embodiment of the disclosure. The carrier assembly 300 is generally similar to the carrier assembly 100 described above with reference to FIGS. 1A-3, except that the illustrated carrier assembly 300 further includes a second replaceable carrier 330 releasably attached to the support structure 110. The second replaceable carrier 330 can be similar or identical to the first replaceable carrier 130. For example, the illustrated second replaceable carrier 330 includes a base 332 and an adhesive layer 340 on a portion of the base 332. The base 332 can be a generally flexible film having a first major surface 334 facing the support structure 110 and a second major surface 338 opposite the first surface 334. The first major surface 334 has a central portion 336a and a generally annular perimeter portion 336b outboard the central portion 336a.

In the illustrated embodiment, the adhesive layer 340 is disposed on the perimeter portion 336b of the first major surface 334 and attaches the base 332 to the second surface 118 of the support structure 110. Although the adhesive layer 340 is not disposed on the central portion 336a of the first major surface 334 in the illustrated embodiment, in other embodiments the adhesive layer 340 may cover the entire first major surface 334. In either case, the second replaceable carrier 330 can be releasably attached to the support structure 110 after the workpiece 250 is coupled to the first replaceable carrier 130. Together, the support structure 110 and the first and second replaceable carriers 130 and 330 define an enclosed chamber 390 within which the workpiece 250 is positioned. The enclosed chamber 390 accordingly protects the workpiece 250 from contaminants and/or damage.

Figure 5:
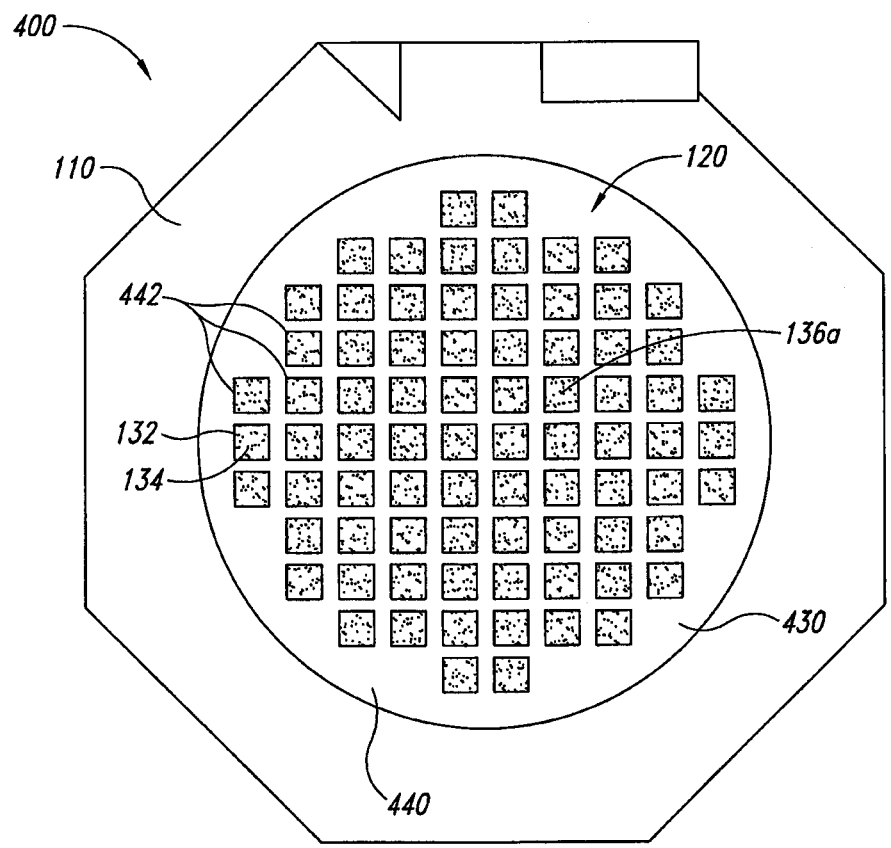
FIG. 5 is a top plan view of a carrier assembly for processing semiconductor workpieces in accordance with another embodiment of the disclosure.

FIG. 5 is a top plan view of a carrier assembly 400 for processing semiconductor workpieces in accordance with another embodiment of the disclosure. The illustrated carrier assembly 400 is generally similar to the carrier assembly 100 described above with reference to FIGS. 1A and 1B. For example, the carrier assembly 400 includes a support structure 110 and a replaceable carrier 430 releasably attached to the support structure 110. The illustrated replaceable carrier 430, however, includes an adhesive layer 440 disposed on some of the central portion 136a of the first major surface 134 in addition to the perimeter portion of the first major surface 134. Specifically, the adhesive layer 440 includes a plurality of apertures 442 that expose sections of the first major surface 134. The illustrated apertures 442 have a rectangular configuration that can correspond to the size of the semiconductor components 150 illustrated in FIGS. 2A and 2B. The apertures 442, for example, can be slightly larger than the semiconductor components that are to be mounted in the apertures 442. As such, the semiconductor components 150 may be placed in corresponding apertures 442 and releasably attached directly to the first major surface 134 without contacting the adhesive layer 440. In other embodiments, the apertures 442 can have a different configuration and/or size. In additional embodiments, the adhesive layer 440 can be disposed on the base 132 in a different arrangement.

From the foregoing, it will be appreciated that specific embodiments of the invention have been described herein for purposes of illustration, but that various modifications may be made without deviating from the invention. For example, many of the elements of one embodiment can be combined with other embodiments in addition to or in lieu of the elements of the other embodiments. Accordingly, the invention is not limited except as by the appended claims.

We claim:

1. A method for processing microelectronic dies, the method comprising:

attaching an adhesive of a replaceable carrier to a support structure having an opening, wherein the replaceable carrier includes a base having a surface with a first portion and a second portion, the adhesive being on the first portion of the surface and the second portion of the surface being exposed from the adhesive, wherein the base is not comprised of an adhesive; and releasably connecting a die to the second portion of the surface of the base with the die positioned at least partially in the opening of the support structure and spaced laterally apart from the adhesive.

2. The method of claim 1 wherein attaching the replaceable carrier to the support structure occurs before releasably connecting the die to the replaceable carrier.

3. The method of claim 1, further comprising decoupling the die from the replaceable carrier.

4. The method of claim 1, further comprising detaching the replaceable carrier from the support structure.

5. The method of claim 1 wherein the replaceable carrier comprises a first replaceable carrier, and wherein the method further comprises:

decoupling the die from the first replaceable carrier;
detaching the first replaceable carrier from the support structure; and
releasably connecting a second replaceable carrier to the support structure in place of the first replaceable carrier.

6. The method of claim 1, further comprising releasably connecting a semiconductor workpiece to the base of the replaceable carrier with the workpiece positioned in the opening and spaced apart from the adhesive, the workpiece including the die.

7. The method of claim 1 wherein the die comprises a first die, and wherein the method further comprises:

releasably connecting a semiconductor workpiece to the base of the replaceable carrier with the workpiece positioned in the opening and spaced apart from the adhesive, the workpiece including the first die and a plurality of second dies; and
cutting the semiconductor workpiece to singulate the first and second dies while the workpiece is connected to the replaceable carrier.

8. The method of claim 1 wherein:

attaching the replaceable carrier to the support structure comprises aligning the second portion of the surface of the base with the opening.

9. The method of claim 1 wherein attaching the replaceable carrier to the support structure comprises positioning the replaceable carrier across the opening of the support structure.

10. The method of claim 1 wherein:

the replaceable carrier comprises a first replaceable carrier; and
the method further comprises releasably coupling a second replaceable carrier to the support structure with the die positioned between the first and second replaceable carriers.

11. A method for processing semiconductor components, the method comprising:

covering at least a portion of a surface of a semiconductor component including a die with a first adhesive; and
releasably attaching the component to a flexible carrier with the first adhesive directly contacting a first portion of a base of the carrier, wherein the carrier further comprises a second adhesive on only a second portion of the base apart from the first portion, wherein the first portion does not include any adhesive where the first portion contacts the component, and wherein the first adhesive is applied to the surface of the component before the semiconductor component is releasably attached to the carrier.

12. The method of claim 11, further comprising detaching the component from the flexible carrier.

13. The method of claim 11, further comprising releasably connecting the flexible carrier to a support structure before releasably attaching the component to the flexible carrier.

14. The method of claim 11 wherein:

the semiconductor component comprises a first semiconductor component; and
the method further comprises releasably attaching a second semiconductor component to the flexible carrier after releasably attaching the first component to the flexible carrier but before detaching the first component from the flexible carrier.

15. A method for processing semiconductor components, the method comprising:

attaching a replaceable carrier to a support structure having an opening, the replaceable carrier having a base with a peripheral portion and a central portion, wherein the peripheral portion is attached to the support structure via an adhesive, and wherein the central portion is generally aligned with the opening of the support structure and includes an exposed surface free from any adhesives; and
releasably attaching a semiconductor component to the exposed surface of the central portion of the base of the replaceable carrier.

16. The method of claim 15 wherein the adhesive is a first adhesive, and wherein the method further comprises applying a second adhesive to a back side of the semiconductor component before releasably attaching the semiconductor component to the replaceable carrier.

17. The method of claim 15 wherein:

the semiconductor component is a first semiconductor component; and
the method further comprises releasably attaching a second semiconductor component to the replaceable carrier after releasably attaching the first semiconductor component to the replaceable carrier but before detaching the first component from the replaceable carrier.

18. The method of claim 15, further comprising disposing the adhesive on the peripheral portion of the base and on portions of the central portion, wherein the adhesive on the central portion includes a plurality of apertures that expose the base.

* * * * *